United States Patent [19]

Kaneko et al.

[11] Patent Number: 5,326,406
[45] Date of Patent: Jul. 5, 1994

[54] METHOD OF CLEANING SEMICONDUCTOR SUBSTRATE AND APPARATUS FOR CARRYING OUT THE SAME

[75] Inventors: Yoshio Kaneko; Munetaka Koda; Tadayoshi Shiraishi; Takehiro Murakami, all of Chiba, Japan

[73] Assignee: Kawasaki Steel Corporation, Kobe, Japan

[21] Appl. No.: 921,722

[22] Filed: Jul. 30, 1992

[30] Foreign Application Priority Data

Jul. 31, 1991 [JP] Japan .................. 3-213236
Nov. 22, 1991 [JP] Japan .................. 3-307834

[51] Int. Cl.$^5$ .................. B08B 3/12; C03C 25/06; C03C 15/00; B44C 1/22
[52] U.S. Cl. .................. 134/1; 134/2; 134/3; 134/95.1; 156/635; 156/643
[58] Field of Search .......... 134/1, 2, 3, 95.1; 156/635, 643

[56] References Cited

U.S. PATENT DOCUMENTS

| | | | |
|---|---|---|---|
| 4,268,374 | 5/1981 | Lepselter | 156/643 |
| 4,615,756 | 10/1986 | Tsujii et al. | 156/635 |
| 4,871,416 | 10/1989 | Fukuda | 156/643 |
| 5,089,084 | 2/1992 | Chhabra | 134/102.1 |
| 5,089,441 | 2/1992 | Moslehi | 134/1 |

OTHER PUBLICATIONS

Japanese Abstracts for laid—open 62,272,541, Nov. 26, 1987.
Japanese Abstracts for laid—open 1-9,621(64-9,621), Jan. 12, 1989.
Japanese Abstracts for laid—open 1-211,952, Aug. 25, 1989.
Japanese Abstracts for laid—open 2-28,322, Jan. 30, 1990.
Scoog et al, Fundamentals of Analytical Chemistry ©1992 Ch. 21, p. 538.

Primary Examiner—R. Bruce Breneman
Assistant Examiner—Thomas G. Dunn, Jr.
Attorney, Agent, or Firm—Oliff & Berridge

[57] ABSTRACT

A semiconductor wafer is placed in a reaction chamber and a cleaning gas is introduced into the reaction chamber. Then, the cleaning gas is excited by irradiation with light rays or heating to produce reactive radicals and a natural oxide film formed on the semiconductor wafer is first removed by the reactive radicals to expose a raw semiconductor wafer surface and then the exposed raw wafer surface is etched by the reactive radicals. Since the natural oxide film is first removed, the exposed raw surface of semiconductor wafer can be etched uniformly over the whole surface, and therefore the highly flat and perfectly crystalline surface can be obtained. It is preferable to introduce a chlorine fluoride series gas such as chlorine trifluoride gas in the cleaning gas. Then, the natural oxide film can be effectively removed by hydrogen fluorine radicals which are produced by irradiating the chloride fluoride series gas with ultraviolet rays.

26 Claims, 11 Drawing Sheets

FIG_2
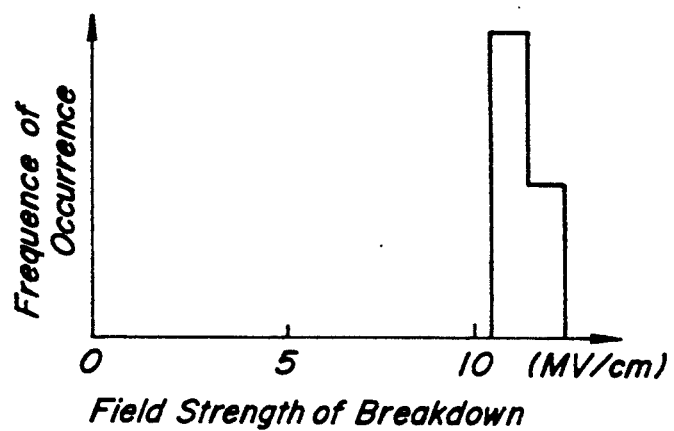
FIG_3
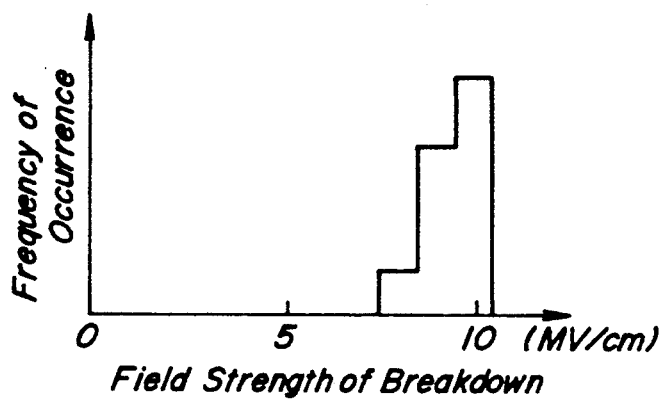

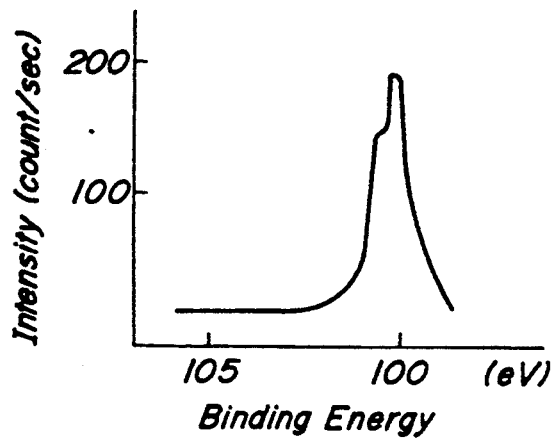
FIG_4
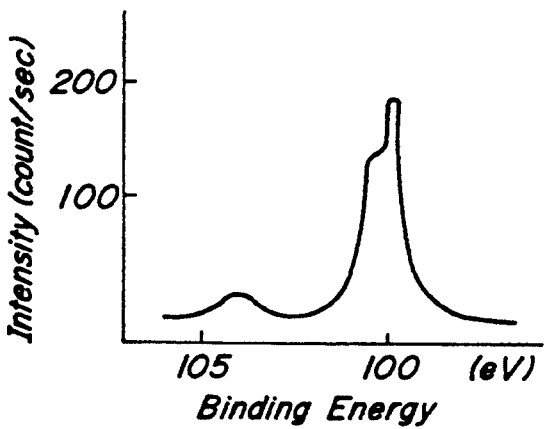
FIG_5
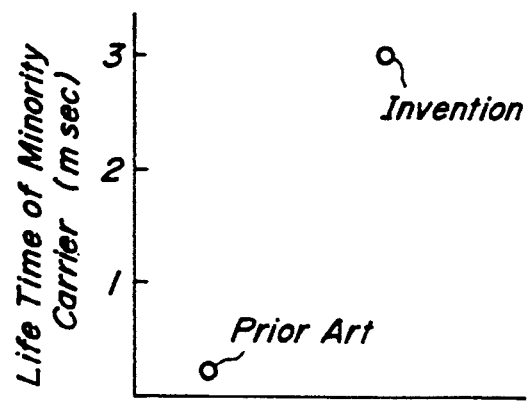
FIG_6

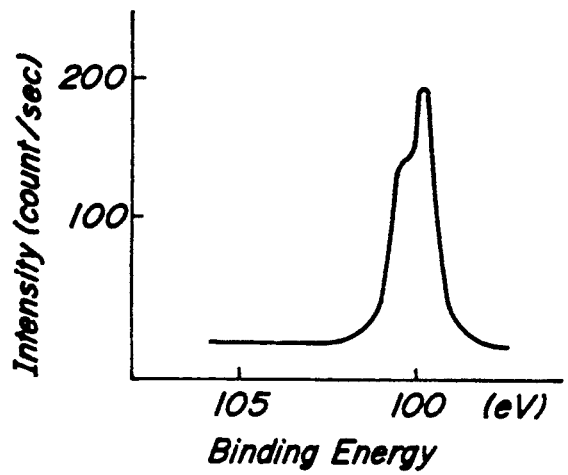
FIG_7
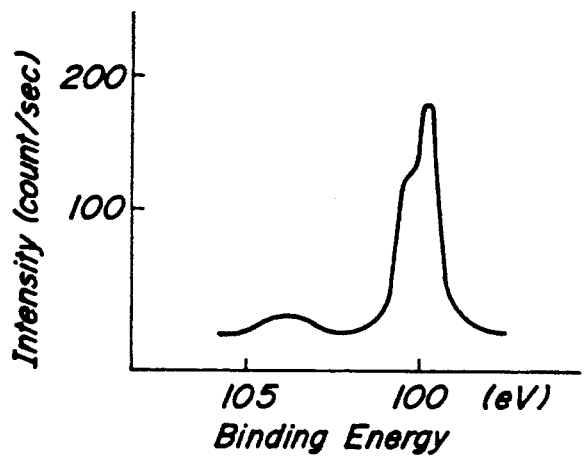
FIG_8
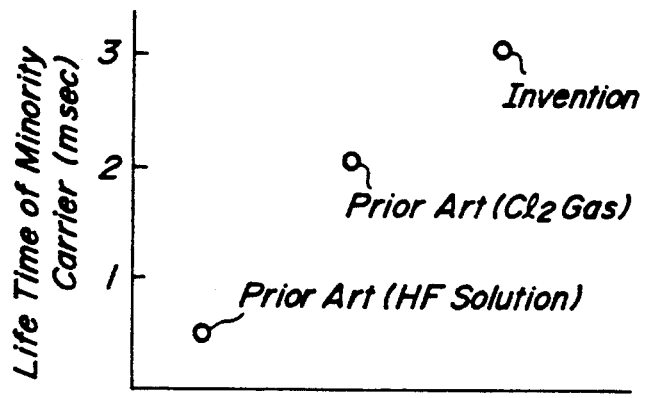
FIG_9

FIG_15

FIG_16

METHOD OF CLEANING SEMICONDUCTOR SUBSTRATE AND APPARATUS FOR CARRYING OUT THE SAME

BACKGROUND OF THE INVENTION

Field of the Invention

The present invention relates to a method of cleaning a semiconductor wafer and an apparatus for carrying out this method, and more particularly to a method of cleaning a surface of a semiconductor wafer by utilizing a cleaning gas.

Description of the Related Art Statement

In the manufacture of LSI, in order to improve its yield, a semiconductor wafer such as a silicon wafer should have a clean, perfect crystalline and flat surface. In order to clean the semiconductor wafer surface, there have been proposed various methods, which may be roughly classified into wet cleaning and gas cleaning. In the wet cleaning a surface of a semiconductor wafer is cleaned with a cleaning liquid. For instance, a mixed liquid of acid and peroxide such as ammonia/hydrogen peroxide, chloride/peroxide, sulfuric acid/peroxide and fluoride/peroxide is used as the cleaning liquid. Further, a scarifying oxidation process has been also used to remove metal impurities applied on the surface of semiconductor wafer.

When the semiconductor wafer is treated by the cleaning liquid mentioned above, a secondary pollution might occur depending upon cleaning liquids to be used. That is to say, impurities which have been removed from the wafer surface might be applied again on the wafer surface. Moreover, in the wet cleaning, the cleaning liquid is hardly inserted into fine recesses formed on the semiconductor wafer and a part of the cleaning liquid which has been introduced in the fine recesses could hardly be replaced by new one, so that it is difficult to perform the cleaning effectively and the natural oxide film formed on the semiconductor wafer surface could not be removed sufficiently. The natural oxide film has an uneven thickness over an entire wafer surface, so that if the natural oxide film is not removed sufficiently, there might be formed protrusions and depressions on the wafer surface after the cleaning. If the silicon wafer has large protrusions and depressions, amorphous silicon halide might remain on the silicon wafer. Then, a density of a silicon oxide film formed on such a silicon wafer surface becomes low and an interface between the silicon wafer surface and the silicon oxide film has very large protrusions and depressions. Therefore, a breakdown voltage of the silicon oxide film becomes low and the property of elements which are formed in such a wafer becomes deteriorated.

When the sacrifying oxidation is performed as the surface cleaning, it is necessary to keep the semiconductor wafer at a very high temperature such as 800° to 1,000° C. for several hours, and thus metal elements on the wafer surface might be diffused into a wafer bulk and could not be removed effectively. Further, impurities injected into the wafer might be re-diffused and impurities in an insulating layer might be diffused, so that property of semiconductor elements which will be formed from this wafer might be deteriorated.

In order to avoid such problems there has been developed a so-called gas cleaning. In this gas cleaning, a gas such as a halogen gas which reacts with silicon to produce volatile silicon compound is excited by irradiating light to produce reactive radicals and these radicals are reacted with the silicon wafer to clean the silicon wafer surface. Such a known method has been disclosed in Japanese Patent Laid-open Publication Kokai Sho 64-9621, in which chlorine gas ($Cl_2$) is used as the reaction gas. In Japanese Patent Laid-open Publication Kokai Hei 2-28322, there is described another known cleaning method in which hydrogen chloride gas (HCl) is used to remove a natural oxide film formed on the silicon wafer surface. In the radical cleaning, heavy metal impurities such as Fe, Cu and Ni and alkali metals such as Na and K and alkaline earth metals such as Ca are converted into volatile chlorides and are easily evaporated from the wafer surface. In this case, the impurities could not be applied again onto the wafer surface, and therefore the wafer surface can be highly cleaned. Upon comparing the radical cleaning with the sacrifying oxidation process, it can be carried out at a low temperature so that the re-diffusion of impurities in the wafer and the diffusion of impurities in the insulating layer can be effectively suppressed.

However, in the known cleaning method in which the chloride gas is used as the reactive gas, it is possible to etch the silicon wafer, but the natural oxide film of about 10Å thickness formed on the silicon wafer could not be removed sufficiently and protrusions and depressions are formed on the silicon wafer surface. Moreover, in the known cleaning method where the reactive gas is formed by a hydrogen chloride gas, it is possible to remove the natural oxide film on the silicon wafer surface, but the silicon wafer has to be heated at a relatively high temperature such as 500° to 550° C., and therefore the re-diffusion and diffusion of impurities might occur and the property of semiconductor elements is liable to be deteriorated.

In Japanese Patent laid-open Publication Kokai Sho 62-272541, there is described another known radical cleaning method, in which after a silicon wafer surface has been cleaned by reactive radicals, a hydrogen gas is introduced into a reaction chamber in order to remove chlorides which are remained on the wafer surface as secondary products. However, in this known method, when a large amount of particles are adhered onto the wafer surface, they could not be removed efficiently, so that although the hydrogen gas is introduced after the radical cleaning, these particles could not be removed at all.

In Japanese Patent Laid-open Publication Kokai Hei 1-211952, there is described still another known cleaning method, in which after a silicon wafer has been cleaned with chlorine radicals, amorphous compounds remained on the silicon wafer surface are removed by heating the wafer in a hydrogen gas. It should be noted that the halogen gas also serves to terminate the silicon wafer surface by the hydrogen.

In this known method, the natural silicon oxide film which has been formed on the silicon wafer surface before the radical cleaning could not be removed efficiently, so that there are formed very large protrusions and depressions, and this results in the deterioration of the property of semiconductor elements as explained above.

In Japanese Patent Laid-open Publication Kokai Hei 3-52224, there has been proposed another known gas cleaning process, in which a semiconductor wafer is introduced into a reaction chamber into which is also introduced a halogen series gas and the halogen series gas is irradiated with ultraviolet rays to produce chlorine radicals and the wafer surface is cleaned with the chlorine radicals. However, this known method could not control the generation of the chlorine radicals so that the natural oxide film could not be removed efficiently.

SUMMARY OF THE INVENTION

The present invention has for its object to provide a novel and useful method of cleaning a semiconductor wafer, in which the natural oxide film formed on the surface of semiconductor wafer can be removed efficiently so that the surface of semiconductor wafer can be made very flat without heating the semiconductor wafer at a high temperature which might cause the undesired re-diffusion and diffusion of impurities.

According to a basic conception of the invention, a method of cleaning a semiconductor wafer comprises the steps of:

introducing a semiconductor wafer having a natural oxide film formed on a surface of semiconductor wafer into a reaction chamber; and cleaning the surface of semiconductor wafer by introducing a cleaning gas including at least a chlorine fluoride series gas into the reaction chamber and exciting the cleaning gas within the reaction chamber to produce reactive radicals and removing the natural oxide film formed on the semiconductor wafer with the reactive radicals to expose a raw surface of the semiconductor wafer, and etching the thus exposed raw surface of the semiconductor wafer.

According to further aspect of the invention, a method of cleaning a semiconductor wafer having a natural oxide film formed on its surface comprises the steps of:

introducing the semiconductor wafer into a reaction chamber;

introducing a cleaning gas containing a chlorine fluoride series gas into the reaction chamber;

exciting the cleaning gas within the reaction chamber to produce hydrogen fluoride radicals;

removing the natural oxide film on the semiconductor wafer with the hydrogen fluoride radicals to expose a raw surface of the semiconductor wafer;

introducing a chlorine fluoride series gas into the reaction chamber;

exciting the chlorine fluoride series gas with ultraviolet rays to produce chlorine and fluorine radicals; and etching said exposed raw surface of the semiconductor wafer by said chlorine and fluorine radicals.

In a preferable embodiment of the cleaning method according to the invention, prior to the step of introducing the semiconductor wafer into the reaction chamber, the semiconductor wafer is cleaned with a cleaning liquid such as a pure water or cleaning agent liquid.

According to further aspect of the invention, a method of cleaning a semiconductor wafer having a natural oxide film formed on its surface comprises the steps of:

introducing the semiconductor wafer into a reaction chamber;

introducing a cleaning gas into the reaction chamber;

exciting the cleaning gas within the reaction chamber in a multi-step manner by selectively irradiating it with radiation rays having different wavelengths to produce reactive radicals;

removing the natural oxide film on the semiconductor wafer with the reactive radicals to expose a raw surface of the semiconductor wafer; and etching the thus exposed raw surface of the semiconductor wafer.

The present invention also relates to an apparatus for cleaning a semiconductor wafer having a natural oxide film formed on its surface and has for its object to provide a novel and useful cleaning apparatus, in which the natural oxide film on the semiconductor wafer can be removed efficiently and a cleaning process can be performed effectively.

According to the invention, an apparatus for cleaning a semiconductor wafer having a natural oxide film formed thereon comprises:

a wet cleaning chamber for cleaning a semiconductor wafer with a pure water or cleaning agent liquid;

a gas cleaning chamber for cleaning the semiconductor wafer with reactive radicals;

a communicating means for communicating said wet cleaning chamber and gas cleaning chamber with each other;

a shutter means for selectively closing said communicating means;

a first transporting means for introducing the semiconductor wafer into said wet cleaning chamber;

a second transporting means for transporting the semiconductor wafer between said wet cleaning chamber and said gas cleaning chamber via said communicating means;

a means for supplying the cleaning liquid into said wet cleaning chamber;

a means for introducing a cleaning gas into said gas cleaning chamber; and a means for irradiating said cleaning gas within said gas cleaning chamber with radiation rays to produce said reactive radicals.

According to further aspect of the invention, an apparatus for cleaning a semiconductor wafer with reactive radicals comprises:

a gas cleaning chamber for cleaning a semiconductor wafer with reactive radicals;

a means for introducing the semiconductor wafer into said gas cleaning chamber;

a means for introducing a cleaning gas into said gas cleaning chamber;

a radiation emitting means including at least two light sources each emitting light rays having different wavelengths; and a control means for controlling said radiation emitting means such that said at least two light sources are operated independently from each other to control the production of said reactive radicals.

BRIEF DESCRIPTION OF THE DRAWINGS

FIG. 2 is a graph representing a breakdown property of an oxide film which is formed on a wafer surface which has been cleaned by the method according to the invention;

FIG. 3 is a graph illustrating the breakdown property of an oxide film formed on a wafer surface which has been cleaned by the known method;

FIG. 4 is a graph showing a test result of an X-ray photoelectron spectroscopy of a wafer surface which has been treated by a second embodiment of the method according to the invention;

FIG. 5 is a graph showing the same test result of a wafer surface which has been processed by a known method;

FIG. 6 is a graph representing life times of minority carriers in thermal oxide films formed on wafer surfaces which have been cleaned by the method according to the invention and a prior art method;

FIG. 7 is a graph showing a test result of an X-ray photoelectron spectroscopy of a wafer surface which has been treated by a third embodiment of the method according to the invention;

FIG. 8 is a graph showing the same test result of a wafer surface which has been processed by a known method;

FIG. 9 is a graph showing life times of minority carriers in thermal oxide films formed on wafer surfaces which have been cleaned by the method according to the invention and a prior art method;

EXPLANATION OF THE PREFERRED EMBODIMENTS

Embodiment 1

In this first embodiment, a mixture of a chlorine fluoride series gas and a hydrogen gas is introduced into a reaction chamber and is excited with ultraviolet rays to produce hydrogen fluoride radicals. On a silicon wafer surface there is formed a very thin natural silicon oxide film having a thickness of about 10 to 20 Å. This natural oxide film is first removed by the hydrogen fluoride radicals to expose a raw surface of silicon wafer. Then, only the chlorine fluoride series gas is introduced into the reaction chamber and is excited with the ultraviolet rays to produce fluorine and chlorine radicals, and the raw surface of silicon wafer is etched by these radicals.

Figure 1:
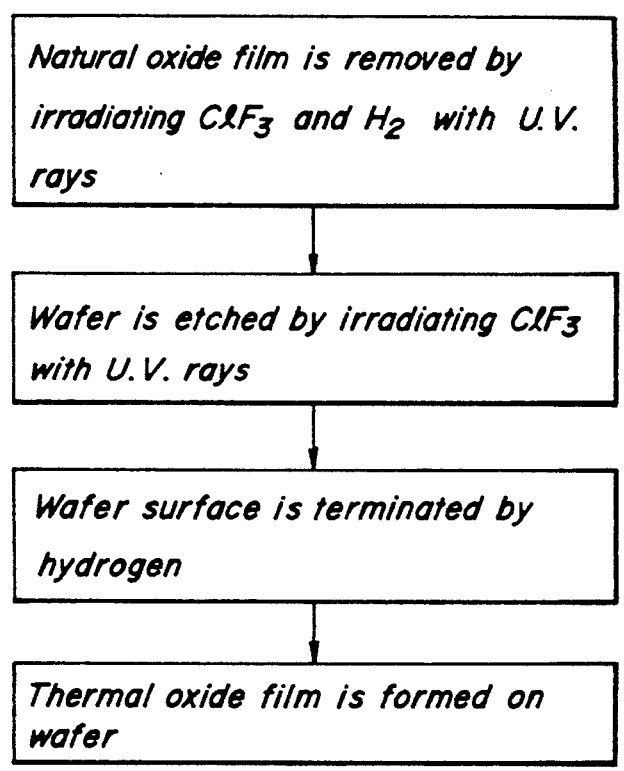
FIG. 1 is a flow chart showing successive steps of a first embodiment of the cleaning method according to the invention.

FIG. 1 is a flow chart showing successive steps of a first embodiment of the cleaning method according to the present invention. In the present embodiment, a P type semiconductor substrate or wafer is introduced into a reaction chamber, and then a cleaning gas mixture of a chlorine trifluoride gas ($ClF_3$) and a hydrogen gas ($H_2$) is supplied from a gas supply box into the reaction chamber. Partial pressures of these chlorine trifluoride gas and hydrogen gas are set to 1 to 100 Torr and 200 to 300 Torr, respectively.

Next, ultraviolet rays having a wavelength of 150 to 350 nm are projected onto a surface of the semiconductor wafer within the cleaning gas mixture. A light source for emitting such ultraviolet rays is preferably constructed by a low pressure mercury vapor discharge lamp. But the invention is not limited to such a lamp, but any light source emitting the ultraviolet rays such as an Excimer laser may be also utilized. The cleaning gas mixture introduced into the reaction chamber is excited with the ultraviolet rays and the following reaction is taken place.

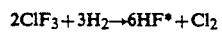
$$2ClF_3 + 3H_2 \rightarrow 6HF^* + Cl_2$$

In this manner there are produced hydrogen. fluorine radicals ($HF^*$) and a natural oxide film formed on the surface of semiconductor wafer is effectively removed by these hydrogen fluoride radicals. Then, a raw surface of semiconductor wafer is exposed.

During this step, chlorine gas is also produced, but it is spontaneously converted into hydrogen chloride ($Cl_2 + H_2 \rightarrow 2HCl$), and thus the etching with the chlorine radicals is not performed and only the natural oxide film is selectively etched away.

Next, the supply of the hydrogen gas is stopped and only the chlorine trifluoride gas is supplied into the reaction chamber such that a pressure of the chlorine trifluoride gas becomes 1 to 100 Torr. After the chlorine trifluoride gas has been flowed into the reaction chamber, the silicon wafer surface is irradiated with the ultraviolet rays. Then, the chlorine trifluoride gas is excited and is divided into fluorine radicals and chlorine radicals and the exposed raw surface of silicon wafer is etched with these radicals.

In the present embodiment, next the hydrogen gas is introduced into the reaction chamber and chlorine radicals remained on the silicon wafer surface are replaced by the hydrogen. In this manner, the wafer surface is terminated by the hydrogen. After that, the oxidation is carried out to form a silicon oxide film having a given thickness on the silicon wafer surface.

FIG. 2 is a graph representing a breakdown property of the finally formed oxide film on the silicon wafer surface. A horizontal axis denotes the field strength of the breakdown voltage and a vertical axis represents a frequency of occurrence of the breakdown with an arbitrary unit. FIG. 3 is a graph showing the same test result of an oxide film which was formed after cleaning a semiconductor wafer only by the chlorine gas. According to the present invention, the field strength of the breakdown voltage is more than 11.0 MV/cm, and in the known method the almost all breakdowns have occurred at the field strength less than 10 MV/cm. It can be experimentally confirmed that the thermal oxide film formed on the silicon wafer surface which has been cleaned by the method according to the invention has a superior insulating property to that of an oxide film formed on the silicon wafer surface which has been treated by the known method. In the above mentioned first embodiment, the chlorine trifluoride gas is used as the chlorine fluoride series gas, but it is also possible to use other chlorine fluoride gas such as chlorine monofluoride gas (ClF), chlorine difluoride gas (ClF$_2$), chlorine pentafluoride gas (ClF$_5$) and dichlorine hexafluoride gas (Cl$_2$F$_6$). Further in the above mentioned embodiment, during the etching with only the chlorine fluoride gas, the silicon wafer is kept at the room temperature, but it may be heated at a temperature up to 300° C.

As explained above, in the first embodiment, the chlorine fluoride gas and hydrogen gas are introduced into the reaction chamber and these gases are excited by irradiating them with the ultraviolet rays to produce the hydrogen fluoride radicals, and the natural oxide film formed on the silicon wafer surface can be efficiently removed by the hydrogen fluoride radicals without heating the wafer at a high temperature. Then, the exposed raw surface of silicon wafer is effectively etched by the fluorine radicals and chlorine radicals which are produced by irradiating the chlorine fluoride gas with the ultraviolet rays. Therefore, the rediffusion of impurities which have been injected into the wafer and the diffusion of impurities in the insulating layer can be effectively suppressed. Further the natural oxide film can be effectively removed, so that the silicon wafer surface can be etched uniformly to obtain a flat surface. Therefore, the heat oxide film having a superior insulating property can be formed.

Embodiment 2

In this second embodiment, a mixture of a chlorine fluoride series gas and a hydrogen or hydrogen chloride gas is introduced into the reaction chamber and a silicon wafer is heated at a temperature of 100° to 600° C. to excite the cleaning gas mixture and hydrogen fluoride radicals are produced by the thermal reaction. The natural silicon oxide film on the silicon wafer is removed by these hydrogen fluoride radicals to expose a raw wafer surface. Then, only the chlorine fluoride series gas is introduced into the reaction chamber and the silicon wafer is heated at a temperature of 100° to 300° C. to produce the fluorine radicals and chlorine radicals. The exposed raw surface of silicon wafer is effectively etched by these fluorine and chlorine radicals.

An N type silicon wafer is placed at a given position within a reaction chamber and then a cleaning gas mixture of a chlorine trifluoride gas and a hydrogen gas is introduced into the reaction chamber at partial pressures of $10^{-3}$ to 10 Torr and 1 to 500 Torr, respectively. Then, the silicon wafer is heated at a temperature of 220° C. to carry out the thermal reaction to produce hydrogen fluoride radicals. The natural oxide film formed on the silicon wafer is effectively removed by the hydrogen fluoride radicals. In the present embodiment, the silicon wafer is heated at a temperature of 220° C. but according to the invention, the silicon wafer may be heated at a temperature within a range of 100° to 600° C. to remove the natural oxide film effectively.

Next, the supply of the hydrogen gas is stopped and only the chlorine trifluoride gas is introduced into the reaction chamber. The chlorine trifluoride gas is thermally excited to produce chlorine and fluorine radicals and the exposed raw wafer surface is etched by these radicals. During this etching process, the silicon wafer is heated at a temperature of 120° C. to increase the metal removing faculty from the silicon surface. This heating temperature may be set to a temperature within a range of 100° to 300° C.

Then, the supply of the chlorine trifluoride gas is stopped and the hydrogen gas is again introduced into the reaction chamber and the chlorine radicals remained on the silicon wafer surface are replaced by hydrogen radicals to terminate the silicon wafer surface by the hydrogen. During this process, the silicon wafer is heated at a temperature of 300° C.

The silicon wafer surface which has been processed in the manner explained above is tested by the X-ray photoelectron spectroscopy to check any possible natural oxide film which might be remained on the wafer surface. FIG. 4 is a graph showing a result of such a test. In FIG. 4 a horizontal axis denotes a binding energy (eV) and a vertical axis represents an intensity (count/second). In the silicon wafer which has been processed by the present embodiment, there is not remained the natural oxide which shows a peak at about 104 eV.

FIG. 5 is a graph representing a result of a similar test in which a silicon wafer has been cleaned by a mixed liquid of ammonia/hydrogen peroxide. The graph shows that a peak is produced near 104 eV so that the natural silicon oxide is remained on the wafer surface. A thickness of the silicon oxide film may be estimated from a peak value to about 6 Å.

FIG. 6 is a graph showing another test result, in which thermal oxide films of 200Å thickness were formed by heating first and second silicon wafers at a temperature of 900° C. in a dry oxygen atmosphere, said first silicon wafer being processed by the above explained second embodiment of the invention and the second silicon wafer being treated by the above mentioned known cleaning method. As can be understood from the graph shown in FIG. 6, according to the invention the life time of minority carrier is longer than the prior art and this means that according to the invention the natural silicon oxide film containing impurities can be fully removed and metal elements applied on the silicon wafer surface can be removed effectively.

Also in the second embodiment, a chlorine fluoride gas other than the chlorine trifluoride gas such as ClF, ClF$_2$, ClF$_5$ and Cl$_2$F$_6$ may be equally used. Further in the above embodiment, the cleaning gas mixture is formed by the chlorine fluoride gas and the hydrogen gas, but it may be formed by the chlorine fluoride gas and a hydrogen chloride gas. Moreover, instead of introducing the cleaning gas mixture of the chlorine fluoride series gas and the hydrogen or hydrochloride gas, it is also possible to introduce a hydrogen fluoride gas into the reaction chamber. In such a case, the introduced hydrogen fluoride gas is excited to produce activated hydrogen fluoride radicals which can effectively etch the natural oxide film formed on the semiconductor wafer.

In the present embodiment, it is not necessary to heat the semiconductor wafer at a high temperature, so that the above explained undesired re-diffusion and diffusion of impurities can be suppressed and thus the property of semiconductor elements can be improved.

Embodiment 3

In the above mentioned first and second embodiments, the cleaning process includes the first cleaning step for removing the natural oxide film to expose the raw surface of silicon wafer and the second cleaning step for etching the exposed raw surface. In the present embodiment, these first and second cleaning steps are performed by a single step. That is to say, a cleaning gas mixture of a chlorine fluoride series gas and a hydrogen chloride gas is introduced into the reaction chamber and is excited by irradiating it with ultraviolet rays to produce chlorine fluoride radicals and chlorine radicals. The natural oxide film formed on the semiconductor wafer surface is removed by the chlorine fluoride radicals and at the same time the raw semiconductor surface is etched by the chlorine radicals.

At first an N type silicon wafer is placed at a given position in a reaction chamber, and then a chlorine trifluoride gas ($ClF_3$) and a hydrogen chloride gas (HCl) are introduced from a gas supply box into the reaction chamber such that partial pressures of these gases are set to $10^{-3}$ to 10 Torr and $10^{-1}$ to 100 Torr, respectively. The silicon wafer is not heated and is kept at the room temperature.

Next, ultraviolet rays having a wavelength of 150 to 350 nm are projected onto a surface of the semiconductor wafer within the cleaning gas mixture. In the present embodiment, the ultraviolet rays are emitted by the low pressure mercury vapor discharge lamp. It is also possible to use an Excimer laser. The cleaning gas mixture introduced into the reaction chamber is excited with the ultraviolet rays and the following reaction is taken place.

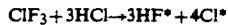

$$ClF_3 + 3HCl \rightarrow 3HF^* + 4Cl^*$$

In this manner there are produced hydrogen fluoride radicals and chlorine radicals within the reaction chamber and the natural silicon oxide film formed on the surface of silicon wafer is effectively removed by the hydrogen fluoride radicals and at the same time the exposed raw surface of silicon wafer is etched by the chlorine radicals.

In the present embodiment, the natural silicon oxide film is removed by the hydrogen fluoride radicals to expose the raw silicon wafer surface and at the same time the raw silicon wafer surface is etched by the chlorine radicals to remove metal elements applied on the silicon wafer surface. In this case, the metal impurities are converted by the chlorine radicals into volatile metal chlorides which are easily removed from the reaction chamber.

FIG. 7 is a graph showing a test result in which the silicon wafer having the surface which has been processed in the manner explained above was measured by the X-ray photoelectron spectroscopy. The graph indicates that a peak for the natural silicon oxide film is not detected.

FIG. 8 is a graph representing a result of a similar test in which a silicon wafer has been processed by a known method in which only a chlorine gas is excited by the ultraviolet rays. It has been experimentally confirmed that in the known method, the natural silicon oxide film having a thickness of more than 5 Å is remained on the silicon wafer surface.

FIG. 9 is a graph showing a test result in which life times of minority carriers were measured for three silicon oxide films formed on silicon wafer surfaces which were cleaned by the above mentioned third embodiment according to the invention and two known cleaning methods. In all cases the silicon oxide films having a thickness of 200 Å were formed by heating the silicon wafers at a temperature of 900° C. in a dry oxygen. In the first known cleaning method, the silicon wafer was cleaned by a hydrofluoric acid cleaning solution, and in the second cleaning method, the silicon wafer was cleaned with exciting a chlorine gas with ultraviolet rays. From the graph illustrated in FIG. 9, it can be understood that the life time of minority carriers in the silicon oxide film formed on the silicon wafer which has been processed by the method according to the invention is longer than those of the silicon oxide films formed on the silicon wafers which have been processed by the known cleaning methods. That is to say, according to the invention the property of the thermal oxide film can be improved.

In the above explained third embodiment, the chlorine trifluoride gas is used as the chlorine fluoride series gas, but according to the invention other chlorine fluoride series gases such as $ClF$, $ClF_2$, $ClF_5$ and $Cl_2F_6$ may be equally used. Further in the above mentioned third embodiment, during the cleaning process the silicon wafer is kept at the room temperature, but it may be heated at a temperature up to 300° C.

Embodiment 4

This fourth embodiment of the method according to the invention is a modification of the first embodiment. That is to say, in the fourth embodiment, prior to the radical cleaning, a semiconductor wafer is cleaned with a cleaning liquid such as a pure water and cleaning agent liquid. Then, particles applied on the semiconductor wafer surface are physically cleaned away and at the same time the effect of the radical cleaning can be enhanced uniformly over the whole wafer surface.

Figure 10:
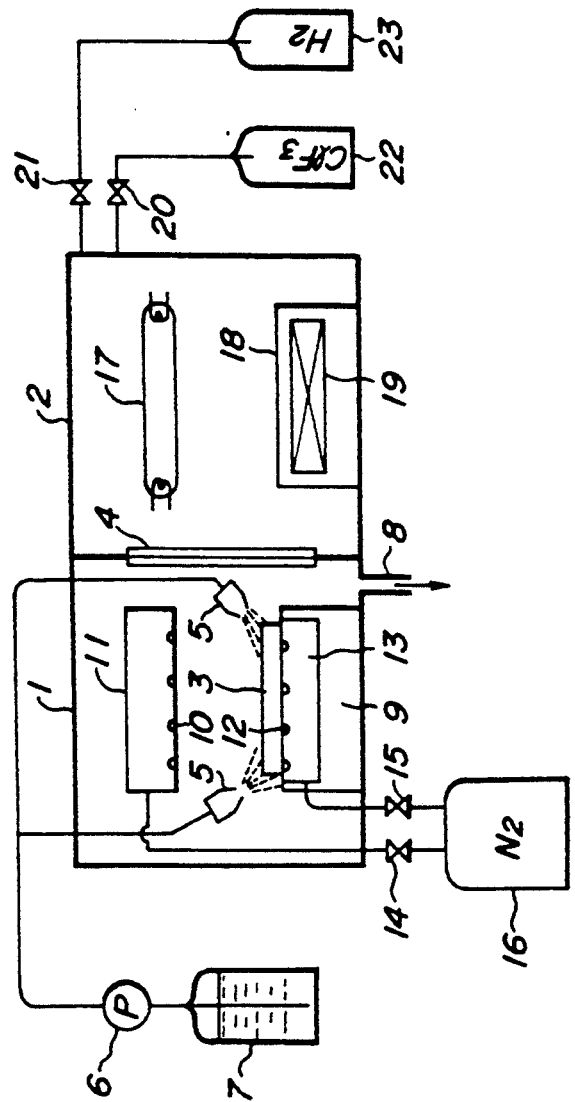
FIG. 10 is a schematic view illustrating an embodiment of the cleaning apparatus according to the invention.

FIG. 10 is a schematic view illustrating a cleaning apparatus according to the invention for carrying out the fourth embodiment of the cleaning method according to the invention. The cleaning apparatus comprises a wet cleaning chamber 1, a radical cleaning chamber 2 which is arranged beside the wet cleaning chamber and wafer transporting opening 4 through which a silicon wafer 3 can be transported between the wet cleaning chamber 1 and the radical cleaning chamber 2. A mechanism for transporting the silicon wafer 3 is not shown in FIG. 10, but it may be constructed by any one of known wafer transporting devices. Further the transporting opening 4 may be closed by a movable door or shutter which is not shown. A mechanism for opening and closing the shutter may be also constructed by any one of known mechanisms.

Within the wet cleaning chamber 1 there are arranged spray nozzles 5 for ejecting a cleaning liquid. In the present embodiment, a pure water is used as the cleaning liquid. The spray nozzles 5 are coupled with a pure water tank 7 via a pump 6. A drain pipe 8 is connected to a bottom of the wet cleaning chamber 1. Within the wet cleaning chamber 1 there is further provided a platform 9 on which the silicon wafer 3 is placed in position. Above the platform 9, there is arranged a blow tube 11 having a number of small holes 10 through which a nitrogen gas is ejected against the silicon wafer 3. In the upper surface of platform 9 there is also arranged a blow tube 13 having a number of small holes 12 through which the nitrogen gas is ejected against the silicon wafer 3. The blow tubes 11 and 13 are connected to a nitrogen gas tank 16 via valves 14 and 15, respectively.

Within the radical cleaning chamber 2 there are provided a light source 17 for emitting ultraviolet rays, a holder 18 for supporting the silicon wafer 3 and an electric heater 19 arranged within the holder 18 for heating the silicon wafer. The radical cleaning chamber 2 is communicated with chlorine fluoride gas tank 22 and hydrogen gas tank 23 by means of valves 20 and 21, respectively. By adjusting these valves 20 and 21, partial pressures of these gases within the radical cleaning chamber 2 can be controlled.

Figure 11:
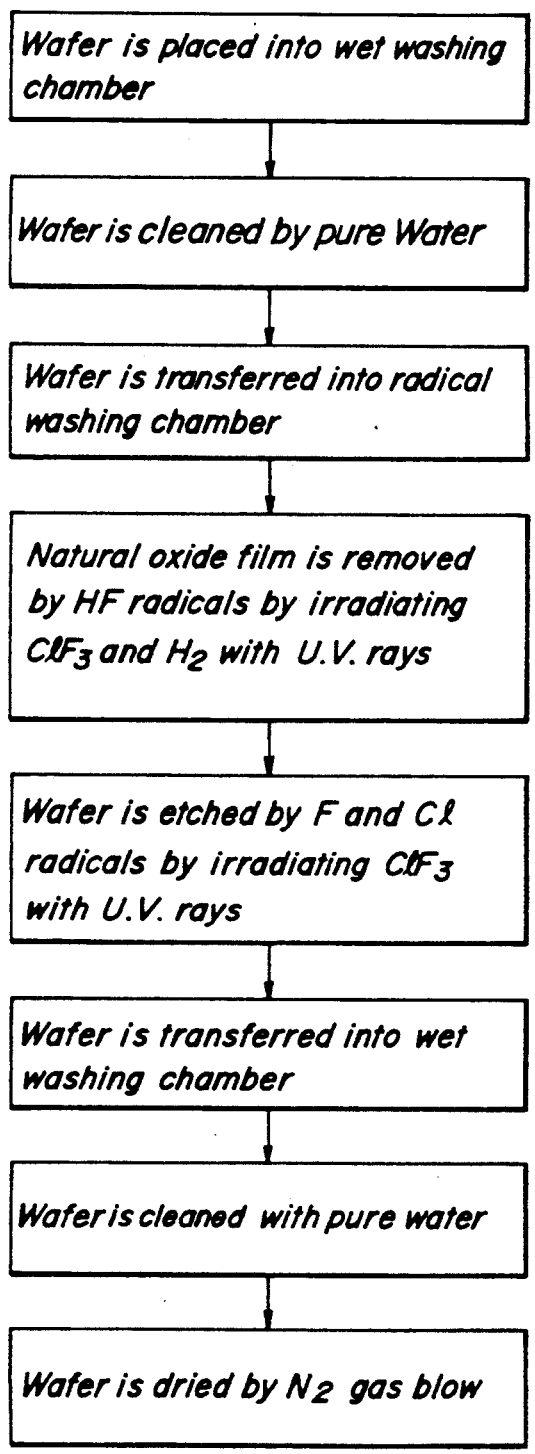
FIG. 11 is a flow chart showing successive steps of a fourth embodiment of the method according to the invention.

FIG. 11 is a flow chart representing successive steps for carrying out the fourth embodiment of the cleaning method according to the invention.

At first, the silicon wafer 3 to be cleaned is introduced into the wet cleaning chamber 1 and is placed on the platform 9. Then, the pump 6 is driven to eject the pure water against the silicon wafer surface from the spray nozzles 5 to wash away particles applied on the silicon wafer surface. During this cleaning process, the transporting opening 4 is closed by the shutter.

Then, the communicating opening 4 is opened and the silicon wafer 3 is transported from the wet cleaning chamber 1 to the radical cleaning chamber 2 via the opening 4 and is placed on the holder 18. After the opening 4 is closed, the valves 20 and 21 are opened and the chlorine trifluoride gas and hydrogen gas are introduced into the radical cleaning chamber 2 from the gas tanks 22 and 23, respectively. The valves 20 and 21 are controlled such that the partial pressures of the chlorine trifluoride gas and hydrogen gas are set to $1 \sim 100$ Torr and $200 \sim 300$ Torr, respectively.

Then, the light source 17 is energized to emit the ultraviolet rays having a wavelength of $150 \sim 350$ nm. Then the cleaning gas mixture is irradiated with the ultraviolet rays. In the present embodiment, the light source 17 is formed by the low pressure mercury vapor discharge lamp. It should be noted that the excitation may be carried out also by an Excimer laser. When the cleaning gas mixture is excited by the ultraviolet rays, there are produced the hydrogen fluoride radicals as in the case of the first embodiment, and the natural silicon oxide film formed on the silicon wafer 3 is removed by these radicals to expose a raw surface of silicon wafer 3.

Next, the valve 21 is closed to stop the supply of the hydrogen gas and only the chlorine trifluoride gas is introduced into the radical cleaning chamber 2 such that a partial pressure of the chlorine fluoride gas is set to $1 \sim 100$ Torr. Then the light source 17 is energized again to irradiate the chlorine trifluoride gas with the ultraviolet rays. Then, the chlorine trifluoride gas is decomposed into fluorine radicals and chlorine radicals and the raw surface of silicon wafer 3 is etched by these radicals. During this third cleaning step, the silicon wafer 3 is heated by the heater 19 at a temperature of $100° \sim 300°$ C. It should be noted that this third cleaning step may be performed without heating the silicon wafer 3. The raw surface of silicon wafer 3 is uniformly etched by the action of the fluorine radicals and chlorine radicals, because the natural silicon oxide film has been removed. During this etching process, metal impurities remained on the silicon wafer surface are converted into volatile chloride compounds which are easily discharged from the radical cleaning chamber 2. This function can be enhanced by heating the silicon wafer at a temperature within a range of $100° \sim 300°$ C.

After the silicon wafer 3 has been cleaned by the radicals in the manner explained above, the communicating opening 4 is opened and the silicon wafer 3 is transferred from the radical cleaning chamber 2 into the wet cleaning chamber 1 via the opening 4 and is placed on the platform 9. Then, the pump 6 is driven to eject the pure water from the spray nozzles 5 onto the silicon wafer to remove the chloride compounds remaining on the silicon wafer surface. After the silicon wafer 3 has been fully cleaned with the pure water, the valves 14 and 15 are opened and the nitrogen gas is ejected from the blow tubes 11 and 13 to dry the silicon wafer. During this drying process, the valves 14 and 15 are adjusted such that the silicon wafer 3 is floated above the platform 9.

In the present embodiment, prior to the radical cleaning, the silicon wafer is cleaned with the pure water or cleaning agent liquid, and thus particles applied on the silicon wafer can be effectively removed and the high cleaning can be attained. Further, during the radical cleaning the natural oxide film is first removed, so that the etching can be carried out uniformly and the highly flat silicon wafer surface can be obtained.

In the above embodiment, the wet cleaning is effected by using the pure water, but according to the invention this may be performed by using hot pure water and cleaning agent liquids such as $NH_4OH/H_2O_2/H_2O$, $CHl/H_2O_2/H_2O$, $H_2SO_4/H_2O_2$ and $HF/H_2O_2$. Moreover, in the present embodiment, after the radical cleaning, the silicon wafer is cleaned again with the pure water, but this later cleaning may be dispensed with.

Figure 12:
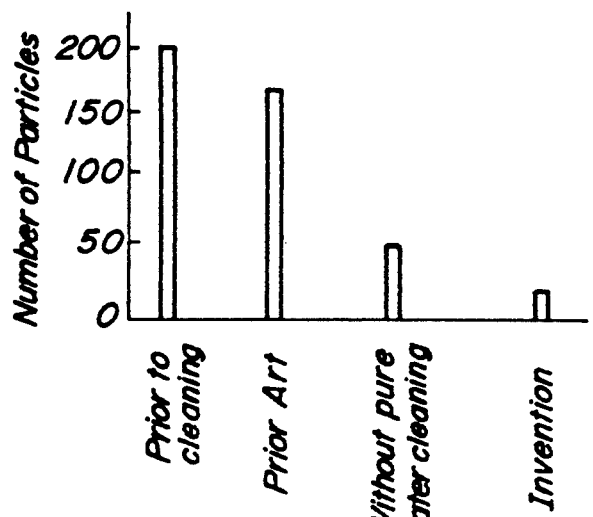
FIG. 12 is a graph denoting a test result in which the number of residual particles on wafer surfaces is measured.

FIG. 12 is a graph showing a test result in which the number of particles remained on the silicon wafer surfaces which were processed in various manners were counted. In this test, particles having a diameter larger than 0.3 $\mu$m were detected. Prior to the cleaning the silicon wafer had a number of particles which amounts to about 200. After the known radical cleaning, there were remained about 160 particles. In the above explained embodiment, particles remained on the silicon wafer were reduced less than about 50. When the pure water cleaning was not effected, about 50 particles were remained on the silicon wafer surface. In this manner, it has been experimentally confirmed that the number of particles remained on the silicon wafer surface can be reduced by the method according to the invention.

Figure 13:
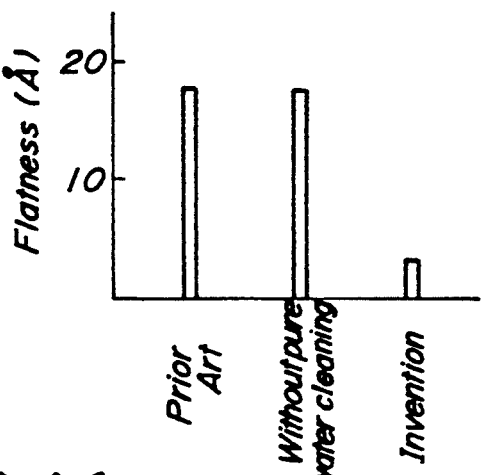
FIG. 13 is a graph showing a test result in which the flatness of wafer surfaces is measured.

FIG. 13 is a graph representing the flatness of the silicon wafers which have been cleaned by the above explained three methods. In the known radical cleaning method and a comparative method in which the pure cleaning step was deleted from the method of the above explained embodiment according to the invention, the silicon wafer surface had the protrusions and depressions amounting to about 18 Å, in the method according to the invention the protrusions and depressions were reduced smaller than about 3 Å. In this manner, it has been experimentally confirmed that the wet cleaning prior to the radical cleaning is very effective when the starting silicon wafer has a number of particles applied thereon.

Figure 14:
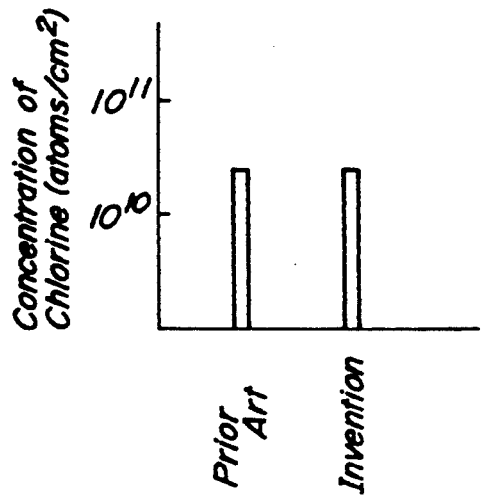
FIG. 14 is a graph representing a test result in which concentrations of chlorine remained on the wafer surface are measured.

FIG. 14 is a graph showing another test result in which a concentration of chlorine remained on the silicon wafer surface was measured. It has been confirmed that in the method of the present embodiment, the chlorine concentration can be made very low as in the case of the known radical cleaning.

In the present embodiment, prior to the radical cleaning the silicon wafer is cleaned with the pure water to remove the particles applied on the wafer surface, and therefore the radical cleaning can be performed uniformly over the whole wafer surface and the flatness of the silicon wafer can be attained. During the radical cleaning at first the natural silicon oxide film is removed by the hydrogen fluoride radicals to expose the raw surface of silicon wafer, and then the exposed raw surface of silicon wafer is etched by the fluorine radicals and chlorine radicals, so that the silicon wafer can be uniformly etched to attain the flat wafer surface. Further when the silicon wafer is cleaned with the pure water after the radical cleaning, the chloride compounds remained on the silicon wafer surface can be effectively removed to achieve the highly cleaned surface.

Moreover, in the cleaning apparatus according to the invention, the wet cleaning chamber and radical cleaning chamber are arranged side by side and these chambers are communicated with each other via the transporting opening, so that the silicon wafer can be transported between these chambers without being subjected to the atmosphere and thus the silicon wafer surface can be kept clean.

Embodiment 5

In this fifth embodiment of the cleaning method according to the invention, the cleaning is carried out by three successive steps. In a first step, a natural oxide film formed on a semiconductor wafer surface is removed by a hydrogen fluoride gas to expose a raw wafer surface, in a second step the raw wafer surface is etched by fluorine radicals and chlorine radicals and in a third step the wafer surface is further etched by hydrogen radicals. In this manner, the semiconductor wafer can be etched uniformly over its entire surface to obtain a highly flat surface. Further during the second cleaning step, the wafer surface is etched by the chlorine radicals and fluorine radicals, so that metals are converted into fluoride compounds and chloride compounds and can be effectively removed from the reaction chamber. During this process there are remained the chloride compounds on the wafer surface, but they can be effectively removed by the hydrogen radicals during said third cleaning step. In this manner, it is possible to obtain a perfect crystalline surface.

Figure 15:
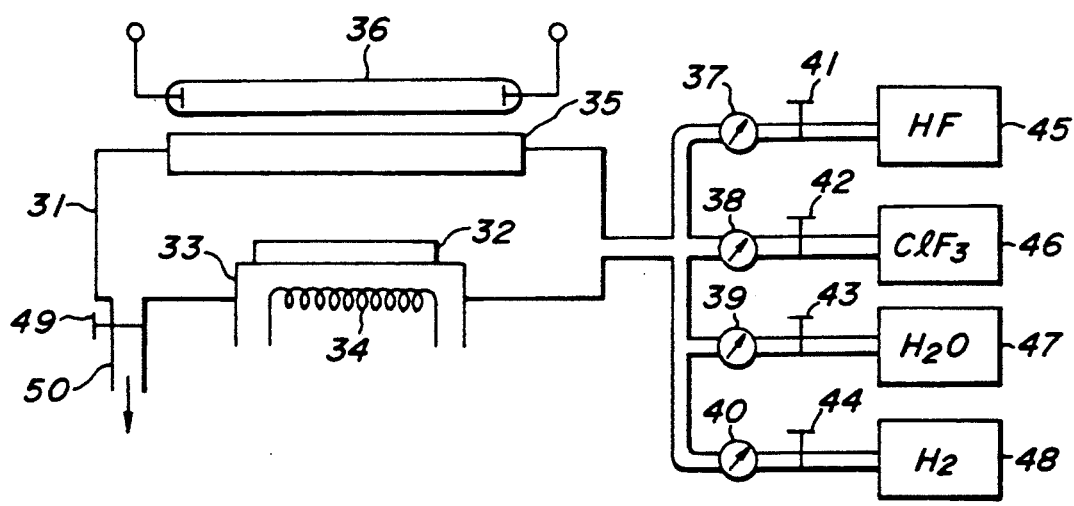
FIG. 15 is a schematic view showing an embodiment of the cleaning apparatus according to the invention.

FIG. 15 is a schematic view illustrating a cleaning apparatus for carrying out the present embodiment of the cleaning method according to the invention. Within a reaction chamber 31 there is arranged a holder 33 for supporting a silicon wafer 32 and an electric heater 34 is provided within the holder 33. A part of a wall defining the reaction chamber 31 is formed by a quartz window 35 and ultraviolet rays emitted from a ultraviolet light source 36 are introduced into the reaction chamber through the quartz window. The reaction chamber 31 is communicated with hydrogen fluoride gas tank 45, chlorine trifluoride gas tank 46, steam tank 47 and hydrogen gas tank 48 by means of flow rate meters 37 to 40 and valves 41 to 44. The reaction chamber 31 is further connected with an exhaust pipe 50 via a valve 49.

Figure 16:
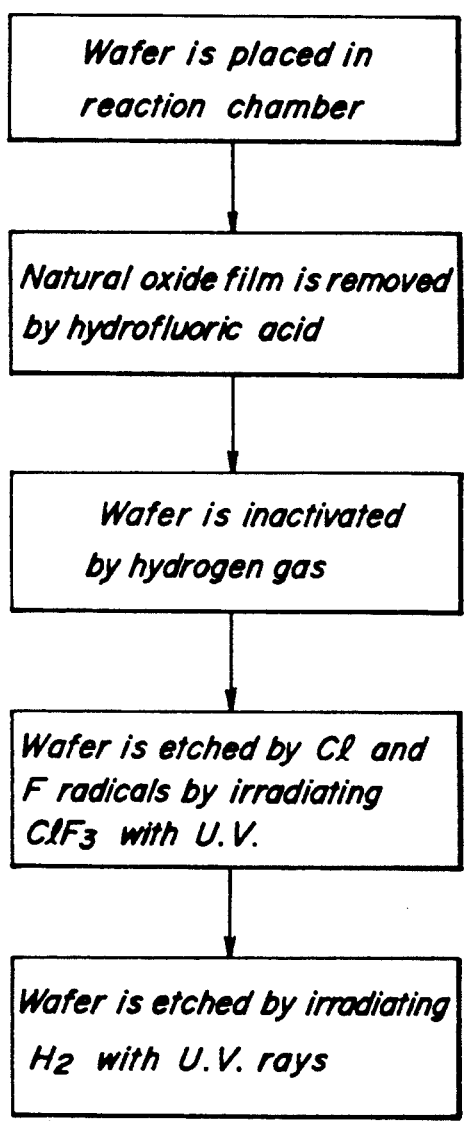
FIG. 16 is a flow chart depicting successive steps in a fifth embodiment of the method according to the invention.

FIG. 16 is a flow chart showing successive steps for cleaning the silicon wafer in the present embodiment. At first, the silicon wafer 32 is inserted into the reaction chamber 31 and is placed on the holder 33. The silicon wafer 32 is heated by the heater 34 at a temperature within a range of 100°~300° C. Then, the valves 41 and 43 are opened and the hydrogen fluoride gas and steam are introduced into the reaction chamber 31. Flow rates of these gases are measured by the flow meters 37 and 39 and are set to 10 ml/minute and 1 ml/minute, respectively. In this manner, the natural silicon oxide film having a thickness of about 10 Å is removed to expose a raw wafer surface.

After the natural silicon oxide film formed on the silicon wafer 32 has been removed in the manner explained above, the valves 41 and 43 are closed and the valve 44 is opened to introduce the hydrogen gas from the hydrogen gas tank 48, so that the raw wafer surface is made inactive.

Next, the valve 44 is closed and the valve 42 is opened to introduce the chlorine trifluoride gas into the reaction chamber 31 from the tank 48 and at the same time the light source 36 is energized to emit the ultraviolet rays having a wavelength of 150 to 350 nm and an intensity of 50 mW/cm$^2$ measured on the silicon wafer surface. The ultraviolet rays are made incident upon the silicon wafer 32 through the quartz window 35. The flow rate of the chlorine trifluoride gas into the reaction chamber 31 is measured by the flow meter 38 and the valve 42 is adjusted such that the flow rate is set to 50 ml/minute. Then, the fluorine radicals and chlorine radicals are produced within the reaction chamber 31 and the exposed raw surface of silicon wafer 32 is etched by these radicals. It should be noted that since the natural oxide film has been removed, the etching is performed uniformly over the whole surface of silicon wafer 32, and thus the highly flat and perfectly crystalline surface can be obtained. Of course, impurities applied on the silicon wafer surface can be effectively removed. That is to say, metals are converted into chloride compounds and fluoride compounds and these compounds are discharged out of the reaction chamber 31 by means of the exhaust pipe 50. During this etching, chloride compounds remain on the silicon wafer, but these compounds can be removed by the next step.

While the light source 36 is energized, the valve 42 is closed and the valve 44 is opened to introduce the hydrogen gas into the reaction chamber 31 from the tank 48 to produce hydrogen radicals. The chloride compounds remaining on the silicon wafer 32 are removed by the hydrogen radicals. In this manner, it is possible to obtain the silicon wafer having a highly flat and perfectly crystalline surface.

Figure 17:
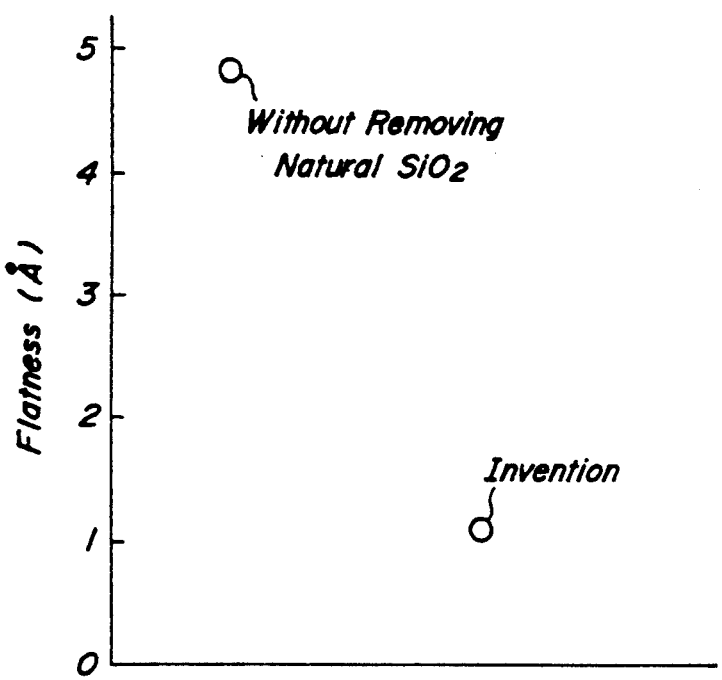
FIG. 17 is a graph showing a test result in which the flatness of wafer surfaces is measured.

FIG. 17 is a graph showing a test result in which the depressions and protrusions formed on the silicon wafer surface were measured by using an interatomic force microscope. In a comparative method a silicon wafer has been processed only by the above mentioned second and third steps. That is to say, the first step for removing the natural oxide film was deleted. The flatness has been estimated by a difference between the maximum protrusion and the maximum depression. In the comparative method the flatness is about 5 nm, but in the method according to the invention, it is possible to attain a flatness of about 1.2 nm.

Figure 18:
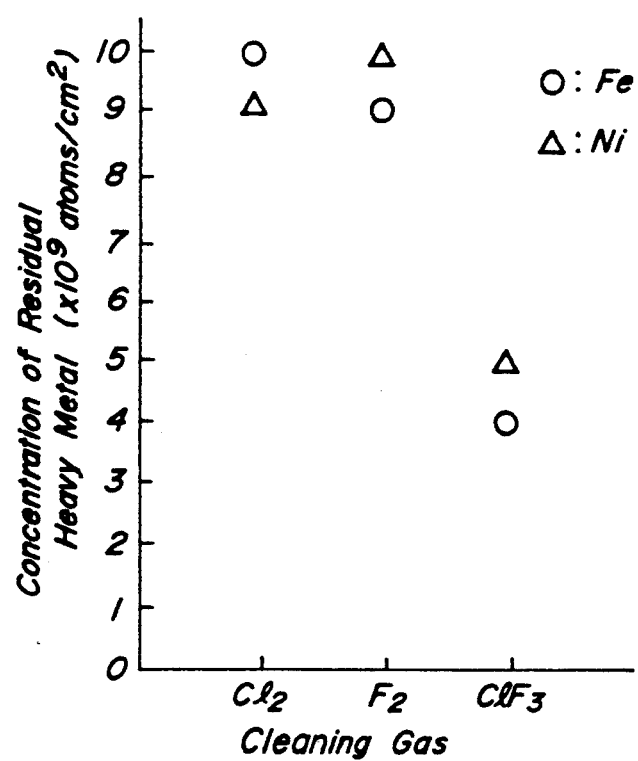
FIG. 18 is a graph representing a test result in which concentrations of residual heavy metals are measured.

FIG. 18 is a graph representing another test result in which a concentration of residual heavy metals after the second step in the above mentioned fifth embodiment was measured. In comparative methods, after the natural oxide film has been removed, the etching was carried out by using a chlorine gas and a fluorine gas instead of the chlorine trifluoride gas. In all methods, the cleaning gas was irradiated with the ultraviolet rays having a wavelength of 150 to 350 nm such that the intensity of the ultraviolet rays measured on the silicon wafers amounts to 50 mW/cm$^2$ and the thickness of silicon wafers was reduced by 10 nm. In the comparative methods in which the etching was performed by the chlorine gas and fluorine gas, the concentrations of residual iron and nickel were high such as $9 \sim 10 \times 10^9$ atoms/cm$^2$, but in the method according to the invention, these heavy metals can be removed up to concentrations of $4 \sim 5 \times 10^9$ atoms/cm$^2$.

In the present embodiment, after the natural oxide film has been removed, the silicon wafer is subjected to the inactivation treatment, but this inactivation process may be dispensed with, because the silicon wafer is not exposed to the atmosphere, so that a new natural oxide film is hardly formed. Further, after the chloride compounds have been removed by the hydrogen radicals, the silicon wafer surface may be terminated with the hydrogen by stopping the irradiation of the ultraviolet rays.

Embodiment 6

In the present sixth embodiment, the excitation of the cleaning gas can be controlled over a wide range in a multi-step manner by utilizing radiations having different wavelengths. That is to say, the reaction is enhanced by the multi-photon excitation, so that the cleaning can be carried out at a lower pressure. Then, a concentration of the cleaning gas can be decreased and thus a concentration of impurities contained therein is also decreased. Further, substances which are produced by the reaction between the cleaning gas and the semiconductor wafer can be easily diffused within the reaction chamber, and therefore the cleaning time can be shortened and at the same time the pollution of the reaction chamber can be reduced.

Figure 19:
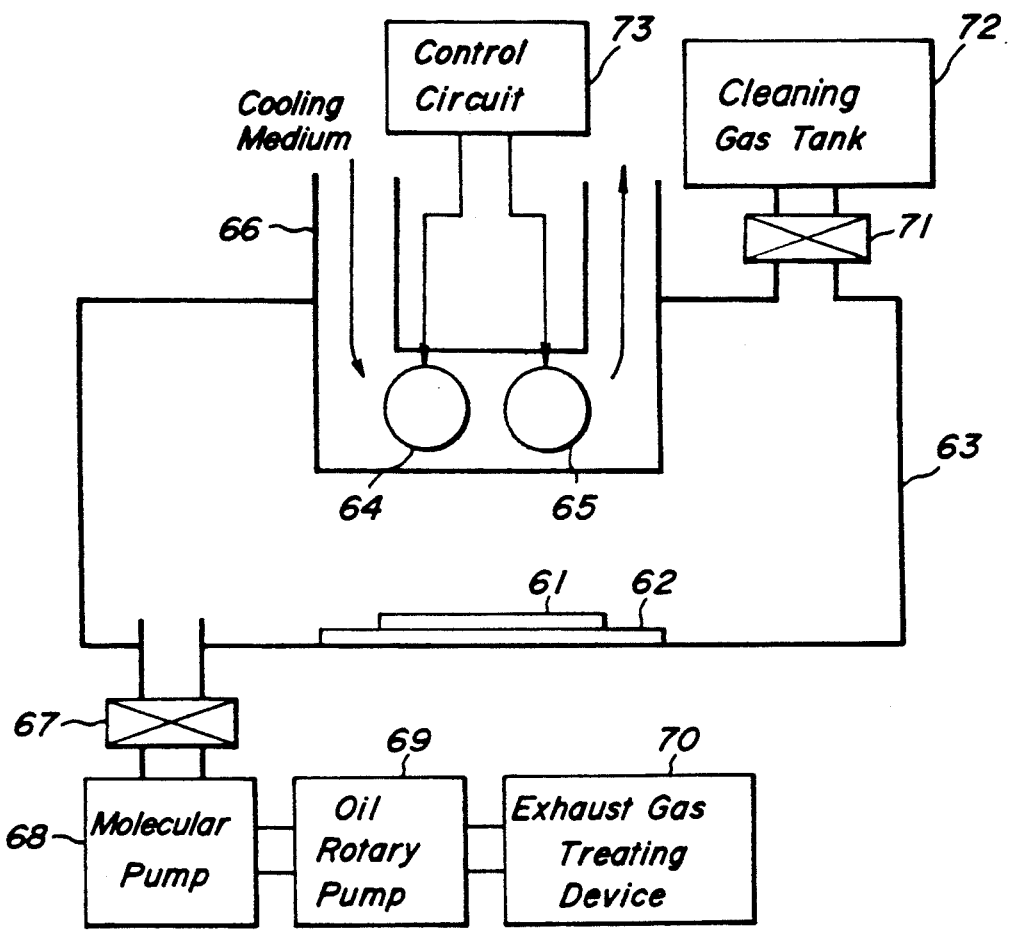
FIG. 19 is a schematic view illustrating an embodiment of the cleaning apparatus according to the invention.

FIG. 19 is a schematic view depicting an embodiment of the cleaning apparatus according to the invention for carrying out the sixth embodiment method of cleaning the semiconductor wafer according to the invention. A silicon wafer 61 to be cleaned is placed on a platform 62 arranged within a reaction chamber 63. Above the reaction chamber 63 there are arranged first and second light sources 64 and 65. These light sources 64 and 65 are provided within a cooling duct 66 and a cooling medium is circulated through the cooling duct to dissipate heat generated by the light sources. Light rays emitted by the first and second light sources 64 and 65 are made incident upon the silicon wafer 61 by means of the cooling medium and the cooling duct 66, and thus they have to be made of materials which transmit the light rays emitted by the light sources.

The reaction chamber 63 is coupled via a valve 67 with a molecular pump 68 which is further connected to an oil rotary pump 69, and this oil rotary pump is further communicated with an exhaust gas treating device 70. In this manner, the reaction chamber 63 can be kept at a desired low pressure. The reaction chamber 63 is further coupled via a valve 71 with a cleaning gas tank 72 such that a cleaning gas can be selectively supplied from the tank 72 into the reaction chamber 63.

In the present embodiment, the first and second light sources 64 and 65 are formed such that the cleaning gas supplied from the cleaning gas tank 72 to the reaction chamber 63 can be excited in a multi-step manner. To this end, the first and second light sources 64 and 65 are constructed to emit light rays having different wavelengths. In the present embodiment, the first light source 64 is formed by a xenon lamp which emits light rays having wavelengths of 400~600 nm and the second light source 65 is constructed by a ultra high pressure mercury lamp emitting ultraviolet rays having wavelengths of 150~350 nm and these light sources are selectively driven by means of a control circuit 73.

Figure 20:
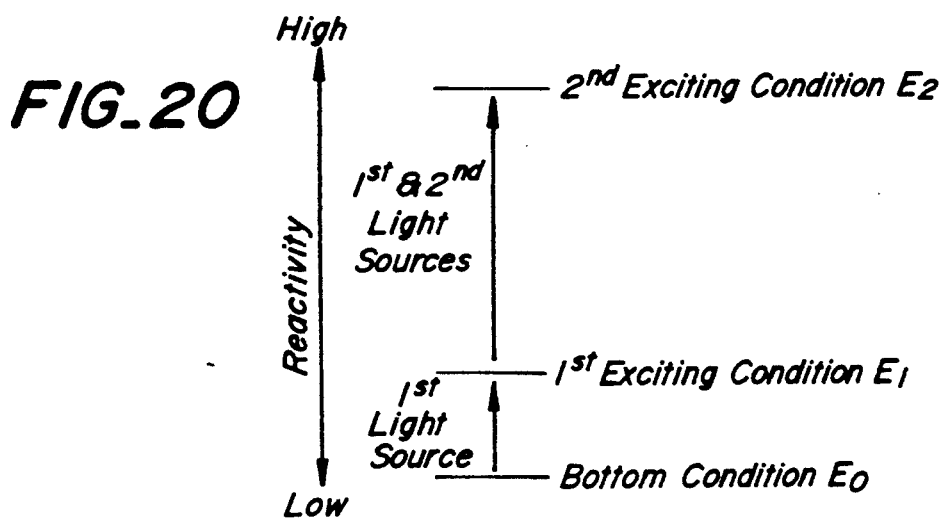
FIG. 20 is a diagram showing a plurality of exciting conditions which are obtained in the apparatus shown in FIG. 19.

FIG. 20 is a schematic view showing the excited condition of the cleaning gas when the first and second light sources 64 and 65 are selectively driven. When the first and second light sources 64 and 65 are not driven, the cleaning gas is in a bottom condition $E_0$ and the activity of the cleaning gas is very low. When only the first light source 64 is energized, the cleaning gas is excited at a first exciting condition $E_1$ and the activity of the cleaning gas becomes high. When both the first and second light sources 64 and 65 are energized simultaneously, the cleaning gas is excited into a second exciting condition $E_2$ and the highest activity can be obtained. In this manner, in the present embodiment, by selectively driving a plurality of light sources it is possible to attain a plurality of exciting conditions so that the activity of the cleaning gas can be controlled over a very wide range.

At first a silicon wafer 61 is placed on the platform 62 within the reaction chamber 63. Then, the valve 67 is opened and the molecular pump 68 and oil rotary pump 69 are driven to reduce the pressure inside the reaction chamber 63 up to $1 \times 10^{-8}$ Torr. Next, the valve 71 is opened and the cleaning gas is introduced from the cleaning gas tank 72 into the reaction chamber 63. In the present embodiment a chlorine gas is used as the cleaning gas. The supply of the chlorine gas into the reaction chamber 63 is controlled such that the pressure inside the reaction chamber is set to $1 \times 10^{-2}$ Torr.

Then, the first and second light sources 64 and 65 are energized to emit the light rays having wavelengths of 400~600 nm and 150~350 nm. The silicon wafer 61 placed within the reaction chamber 63 is irradiated with these light rays and the cleaning gas is excited at the second exciting condition $E_2$. Therefore, the cleaning gas is excited to a large extent and a very large amount of chlorine radicals are produced, and thus the silicon wafer is etched effectively. Since the activity of the cleaning gas can be increased, the pressure of the cleaning gas can be reduced and the cleaning process can be performed efficiently and the pollution of the reaction chamber can be reduced.

After that the second light source 65 is de-energized and the chlorine gas within the reaction chamber 63 is excited at the first exciting condition $E_1$. Therefore, the activity of the chlorine gas is decreased, but it is higher than the bottom condition $E_0$. In this manner, the production of the protrusions and depressions after the removal of the natural silicon oxide film can be prevented effectively and a flat wafer surface can be attained.

Next the first light source 64 is de-energized and the silicon wafer 61 is removed out of the reaction chamber 63. It has been experimentally confirmed by the interatomic force microscope that the flatness of the thus processed silicon wafer surface is less than 5 Å.

In the above explained sixth embodiment, the cleaning gas is formed by the chlorine gas, but it may be formed by any other gas such as halogen series gas and a solution containing halogen series substance. Moreover, the first and second light sources 64 and 65 may be constructed by any other lamps which emit light rays having different wavelengths. Further, the number of light sources is not limited to two, but may be three or more than three.

The present invention is not limited to the above explained embodiments, but many modifications and alternations may be conceived by those skilled in the art within the scope of the invention. For instance, in the sixth embodiment 6, the chlorine gas is used as the radical cleaning gas, but any suitable radical cleaning gas such as the chlorine fluoride series gas used in the embodiments 1 to 5 may be utilized. For example, in the first and fourth embodiments, during the first radical cleaning step, the cleaning gas mixture of the chlorine fluoride series gas and the hydrogen gas may be excited in the multi-step manner by selectively operating a plurality of light sources which emit ultraviolet rays having different wavelengths. Moreover, during the second radical cleaning step, the chlorine fluoride series gas may be excited in the multi-step manner.

What is claimed is:

1. A method of cleaning a semiconductor wafer comprising the steps of:
   introducing the semiconductor wafer having a natural oxide film formed on a surface of the semiconductor wafer into a reaction chamber; and
   cleaning the surface of the semiconductor wafer by introducing a cleaning gas including at least a chlorine fluoride series gas into the reaction chamber and exciting the cleaning gas within the reaction chamber to produce reactive radicals and removing the natural oxide film formed on the semiconductor wafer with the reactive radicals to expose a raw surface of the semiconductor wafer, and etching the exposed raw surface of the semiconductor wafer.

2. A method according to claim 1, wherein during said cleaning step, said cleaning gas is irradiated with radiation rays.

3. A method according to claim 2, wherein said radiation rays include ultraviolet rays.

4. A method according to claim 2, wherein said cleaning gas is irradiated with radiation rays having different wavelengths such that the excitation is performed in a multi-step manner.

5. A method according to claim 3, wherein said cleaning step includes a first cleaning step in which a first cleaning gas containing a chlorine fluoride series gas and a hydrogen gas is introduced into the reaction chamber, irradiating the first cleaning gas with ultraviolet rays to produce hydrogen fluoride radicals, and removing the natural oxide film formed on the surface of semiconductor wafer by said hydrogen fluoride radicals to expose a raw surface of the semiconductor surface; and a second cleaning step in which a second cleaning gas containing a chlorine fluoride series gas is introduced into the gas cleaning chamber, the second cleaning gas is irradiated with ultraviolet rays to produce fluorine radicals and chlorine radicals, and said raw surface of the semiconductor wafer is etched by said fluorine radicals and chlorine radicals.

6. A method according to claim 5, wherein said chlorine fluoride series gas is selected from the group consisting of ClF, ClF$_2$, ClF$_3$, ClF$_5$ and Cl$_2$F$_6$.

7. A method according to claim 6, wherein during said first cleaning step, a chlorine trifluoride gas and the hydrogen gas are introduced into the reaction chamber at partial pressures of 1 to 100 Torr and 200 to 300 Torr, respectively, these gases are excited by irradiating them with the ultraviolet rays having a wavelength of 150 to 350 nm, and said semiconductor wafer is kept at the room temperature; and during said second cleaning step a chlorine trifluoride gas is introduced into the reaction chamber at a pressure of 1 to 100 Torr and said semiconductor wafer is kept at a temperature within a range from room temperature to 300° C.

8. A method according to claim 6, wherein said cleaning step further includes a third cleaning step in which a hydrogen gas is introduced into the reaction chamber to remove chloride compounds remaining on the semiconductor wafer surface and terminate the semiconductor wafer surface with the hydrogen gas.

9. A method according to claim 5, wherein each of said irradiating steps in the first and second cleaning steps is performed by irradiating said first cleaning gas with the ultraviolet rays and visible light rays or ultraviolet rays having wavelengths different from that of other said ultraviolet rays.

10. A method according to claim 3, wherein said cleaning step includes introducing the cleaning gas containing a chlorine fluoride series gas and a hydrogen chloride gas into the reaction chamber, irradiating said cleaning gas with the ultraviolet rays to produce hydrogen fluoride radicals and chlorine radicals, removing the natural oxide film by said hydrogen fluoride radicals to expose the raw surface of semiconductor wafer and etching said raw surface of semiconductor wafer with said chlorine radicals.

11. A method according to claim 10, wherein said chlorine fluoride series gas is selected from the group consisting of ClF, ClF$_2$, ClF$_3$, ClF$_5$ and Cl$_2$F$_6$, and said chlorine fluoride series gas and the hydrogen chloride gas are introduced into the reaction chamber at partial pressures of $10^{-3}$ to 10 Torr and $10^{-1}$ to 100 Torr, respectively and are irradiated with the ultraviolet rays having a wavelength of 150 to 350 nm, and said semiconductor wafer is kept at room temperature.

12. A method according to claim 10, wherein said irradiating step in the cleaning step is carried out by irradiating said cleaning gas with the ultraviolet rays and visible light rays or ultraviolet rays having a wavelength which is different from that of others of said ultraviolet rays.

13. A method according to claim 1, wherein said cleaning step is further performed by heating the semiconductor wafer within the reaction chamber to produce the reactive radicals by a thermal reaction.

14. A method according to claim 13, wherein said cleaning step includes a first cleaning step in which the cleaning gas containing a chlorine fluoride series gas and a hydrogen or hydrogen chloride gas is introduced into the gas cleaning chamber, the semiconductor wafer is heated to produce hydrogen fluoride radicals by a thermal reaction, and the natural oxide film is removed by said hydrogen fluoride radicals to expose the raw surface of semiconductor wafer; and a second cleaning step in which the chlorine fluoride series gas is introduced into the reaction chamber, the semiconductor wafer is heated to produce fluorine radicals and chlorine radicals by a thermal reaction, and the raw surface of the semiconductor wafer is etched by said fluorine radicals and chlorine radicals.

15. A method according to claim 14, wherein said chlorine fluoride series gas is selected from the group consisting of ClF, ClF$_2$, ClF$_3$, ClF$_5$ and Cl$_2$F$_6$, during said first cleaning steps, said semiconductor wafer is heated at a temperature of 100° to 600° C. and the chlorine fluoride series gas and hydrogen or hydrogen chloride gas are introduced into the reaction chamber at partial pressures of $10^{-3}$ to 10 Torr and 1 to 500 Torr, respectively, and during said second cleaning step said semiconductor wafer is heated at a temperature of 100° to 300° C.

16. A method according to claim 5, wherein prior to the step of introducing the semiconductor wafer into the reaction chamber, the semiconductor wafer is cleaned with a cleaning liquid.

17. A method according to claim 16, wherein said semiconductor wafer is cleaned with a pure water which is heated or at room temperature.

18. A method according to claim 16, wherein said semiconductor wafer is cleaned with a cleaning agent liquid selected from the group consisting of $NH_4OH/H_2O_2/H_2O$, $HCl/H_2O_2/H_2O$, $H_2SO_4/H_2O_2$ and $HF/H_2O_2$.

19. A method according to claim 3, wherein said gas cleaning step includes
 a first gas cleaning step for introducing a hydrofluoric acid gas into said reaction chamber to remove the natural oxide film on the surface of the semiconductor wafer such that the raw surface of the semiconductor wafer is exposed;
 a second gas cleaning step for introducing a cleaning gas containing a chlorine fluoride series gas into said reaction chamber, and irradiating the cleaning gas with ultraviolet rays to produce fluorine radicals and chlorine radicals and etching said raw surface of the semiconductor wafer with said fluorine radicals and said chlorine radicals; and
 a third gas cleaning step for introducing a hydrogen gas into said reaction chamber and irradiating the hydrogen with the ultraviolet rays to produce hydrogen radicals and etching the raw surface of the semiconductor wafer with said hydrogen radicals.

20. A method according to claim 19, wherein during said first cleaning step steam is introduced into the reaction chamber and the semiconductor wafer is heated at a temperature of 100° to 300° C. during said second gas cleaning step, a chlorine trifluoride gas is irradiated with radiation rays having at least two different wavelengths including ultraviolet rays having a wavelength of 150 to 350 nm, and between said first and second cleaning steps, a hydrogen gas is introduced into the reaction chamber to terminate the semiconductor wafer surface with the hydrogen gas.

21. A method of cleaning a semiconductor wafer comprising the steps of:
 introducing a semiconductor wafer having a natural oxide film formed on a surface of the semiconductor wafer into a reaction chamber;
 introducing a cleaning gas into the reaction chamber;
 exciting the cleaning gas within the reaction chamber in a multi-step manner by selectively irradiating the cleaning gas with radiations having different wavelengths to produce reactive radicals;
 removing the natural oxide film on the semiconductor wafer with the reactive radicals to expose a raw surface of the semiconductor wafer; and
 etching the exposed raw surface of the semiconductor wafer.

22. A method according to claim 21, further comprising the steps of introducing a chlorine gas into the reaction chamber at a pressure of $1 \times 10^{-2}$ Torr and selectively irradiating the chlorine gas with first radiation rays having a wavelength of 150 to 350 nm and second radiation rays having a wavelength of 400 to 600 nm.

23. An apparatus for cleaning a semiconductor wafer having a natural oxide film formed thereon comprising:
 a wet cleaning chamber for cleaning a semiconductor wafer with a pure water or a cleaning agent liquid;
 a gas cleaning chamber for cleaning the semiconductor wafer with reactive radicals;
 communicating means for communicating said wet cleaning chamber and said gas cleaning chamber with each other;
 shutter means for selectively closing said communicating means;
 first transporting means for introducing the semiconductor wafer into said wet cleaning chamber;
 second transporting means for transporting the semiconductor wafer between said wet cleaning chamber and said gas cleaning chamber via said communicating means;
 means for supplying the cleaning liquid into said wet cleaning chamber;
 means for introducing a cleaning gas into said gas cleaning chamber;
 means for exciting the cleaning gas within the gas cleaning chamber to produce reactive radicals and remove the natural oxide film formed on the semiconductor wafer; and
 means for etching the exposed surface of the semiconductor wafer.

24. An apparatus according to claim 23, wherein said means for supplying the cleaning liquid comprises at least one spray nozzle for ejecting the cleaning liquid against the semiconductor wafer, a cleaning liquid tank for containing said cleaning liquid, said cleaning liquid tank being arranged outside the wet cleaning chamber, a pipe for coupling said spray nozzle with said cleaning liquid tank and a pump inserted in said pipe.

25. An apparatus for cleaning a semiconductor wafer with reactive radicals comprising:
 a gas cleaning chamber for cleaning a semiconductor wafer with reactive radicals;
 means for introducing the semiconductor wafer into said gas cleaning chamber;
 means for introducing a cleaning gas into said gas cleaning chamber; and
 radiation emitting means including at least two light sources, each emitting light rays having different wavelengths; and
 control means for controlling said radiation emitting means such that said at least two light sources are operated independently from each other, a first one of said light sources used to excite the cleaning gas within the gas cleaning chamber to produce reactive radicals which remove a natural oxide film on said semiconductor wafer and a second one of said light sources used to excite the cleaning gas to produce reactive radicals which etch an exposed surface of said semiconductor wafer.

26. An apparatus according to claim 25, wherein said first light source comprises a xenon lamp which emits light rays having a wavelength of 400 to 600 nm, and said second light source comprises an ultra high pressure mercury vapor discharge lamp which emits ultrasonic rays having a wavelength of 150 to 350 nm.

* * * * *